United States Patent [19]

Padoan et al.

[11] Patent Number: 5,559,449

[45] Date of Patent: Sep. 24, 1996

[54] PROGRAMMABLE LOGIC ARRAY STRUCTURE FOR SEMICONDUCTOR NONVOLATILE MEMORIES, PARTICULARLY FLASH-EEPROMS

[75] Inventors: Silvia Padoan, Rimini; Luigi Pascucci, San Giovanni, both of Italy

[73] Assignee: SGS-Thomson Microelectronics S.r.l., Agrate Brianza, Italy

[21] Appl. No.: 391,149

[22] Filed: Feb. 21, 1995

[30] Foreign Application Priority Data

Feb. 18, 1994 [EP] European Pat. Off. ............. 94830072

[51] Int. Cl.[6] ...................... H03K 19/177; H03K 19/173
[52] U.S. Cl. ................................................ 326/40; 326/39
[58] Field of Search .................................. 326/40, 39, 46

[56] References Cited

U.S. PATENT DOCUMENTS

| | | | |
|---|---|---|---|
| 4,488,229 | 12/1984 | Harrison | 326/40 |
| 4,661,922 | 4/1987 | Thierbach | 326/40 |
| 4,700,088 | 10/1987 | Tubbs | 326/40 |
| 4,740,721 | 4/1988 | Chung et al. | 326/40 |
| 4,760,290 | 7/1988 | Martinez | 307/465 |
| 4,769,562 | 9/1988 | Ghisio | 326/40 |
| 5,136,186 | 8/1992 | Trinh et al. | 307/443 |
| 5,221,867 | 6/1993 | Mitra et al. | 307/465 |

FOREIGN PATENT DOCUMENTS 0311046 4/1989 European Pat. Off. .

OTHER PUBLICATIONS

Lin, "A 4μm NMOS NAND Structure PLA," *IEEE J. of Solid–State Circuits* 16(2): 103–107, 1981.

Linz, "A Low–Power PLA for a Signal Processor," *IEEE J. of Solid–State Circuits* 26 (2): 107–115, 1991.

*Primary Examiner*—Edward P. Westin
*Assistant Examiner*—Richard Roseen
*Attorney, Agent, or Firm*—David V. Carlson; Seed and Berry LLP

[57] ABSTRACT

The PLA, which implements a state machine of a nonvolatile memory, presents a dynamic NAND-NOT-NOR configuration, and the timing signals for correct reading of the PLA are generated by a clock generator which generates a monostable succession of read enabling signals on receiving a predetermined switching edge of an external clock signal. The clock generator enables evaluation of the AND and OR planes of the PLA and subsequently storage of the results through sections duplicating the propagation delays of the signals in the corresponding parts of the PLA. Reading is terminated as soon as completion of the storage step is indicated, so that reading of the PLA lasts only as long as strictly necessary, thus preventing erroneous switching while at the same time ensuring correct reading of the PLA.

28 Claims, 3 Drawing Sheets

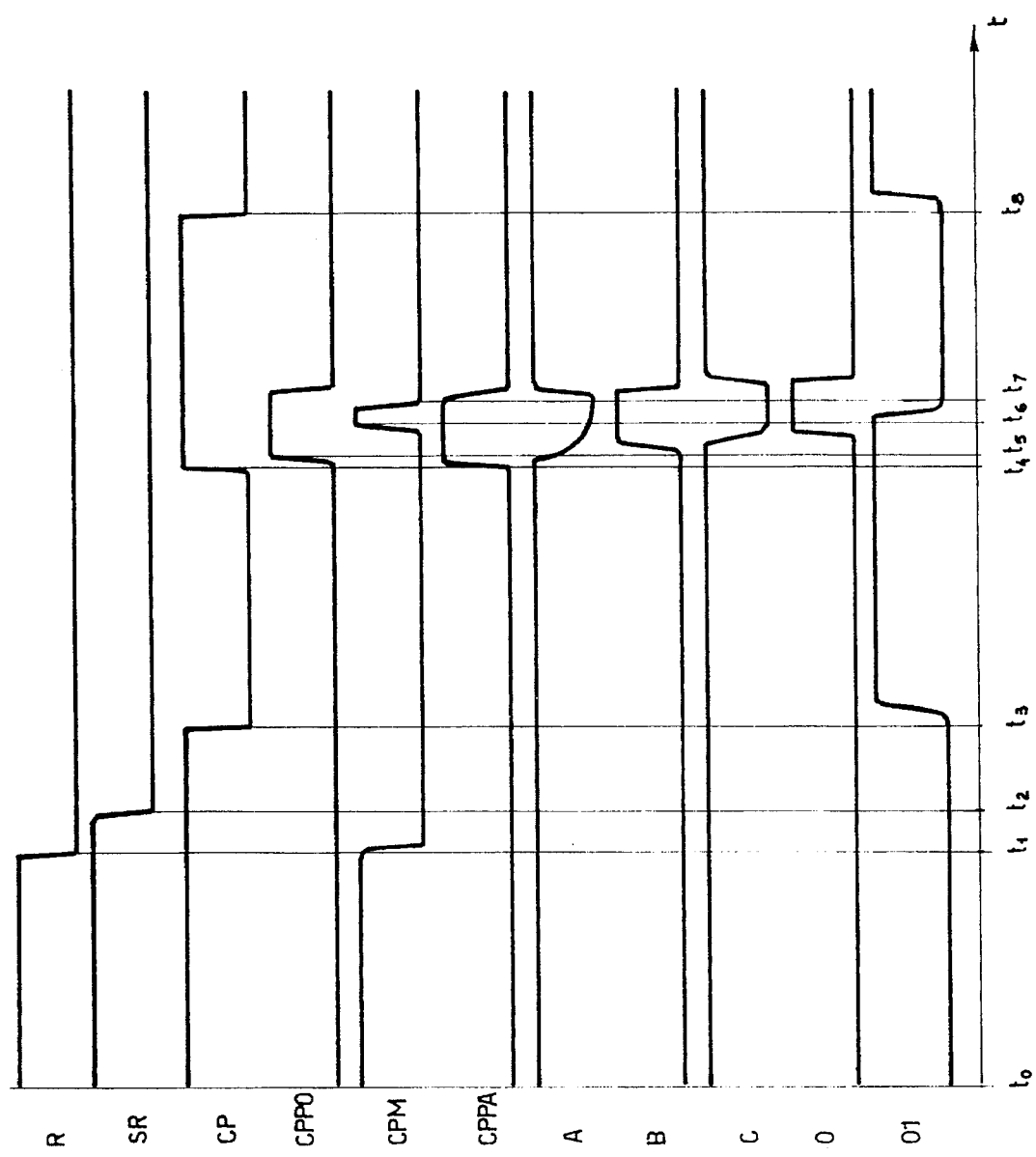

PROGRAMMABLE LOGIC ARRAY STRUCTURE FOR SEMICONDUCTOR NONVOLATILE MEMORIES, PARTICULARLY FLASH-EEPROMS

CROSS REFERENCE TO RELATED APPLICATIONS

The present application claims priority from European Patent Application No 94830072.8, filed Feb. 18, 1994, and incorporated herein by reference. The present application is related to pending U.S. patent application Ser. No. 08/391,160 entitled "METHOD AND CIRCUIT FOR TIMING THE LOADING OF NONVOLATILE-MEMORY OUTPUT DATA", by Luigi Pascucci, Marco Maccarrone and Marco Olivo, and filed on Feb. 21, 1995, which claims priority from European Patent Application No. 94830069.4, filed on Feb. 18, 1994; U.S. patent application Ser. No. 08/391,159 entitled "INTERNAL TIMING METHOD AND CIRCUIT FOR PROGRAMMABLE MEMORIES", by Luigi Pascucci, Marco Olivo and Carla Maria Golla, and filed on Feb. 21, 1995, which claims priority from European Patent Application No. 94830070.2, filed on Feb. 18, 1994; U.S. patent application Ser. No. 08/391,146 entitled "LOAD SIGNAL GENERATING METHOD AND CIRCUIT FOR NONVOLATILE MEMORIES", by Luigi Pascucci and Carla Maria Golla, and filed on Feb. 21, 1995, which claims priority from European Patent Application No. 94830071.0, filed on Feb. 18, 1994; U.S. patent application Ser. No. 08/391,147 entitled "METHOD AND CIRCUIT FOR SUPPRESSING DATA LOADING NOISE IN NONVOLATILE MEMORIES", by Luigi Pascucci, Carla Maria Golla and Marco Maccarrone, and filed on Feb. 21, 1995, which claims priority from European Patent Application No. 94830073.6, filed on Feb. 18, 1994; U.S. patent application Ser. No. 08/391,920 entitled "METHOD AND CIRCUIT FOR TIMING THE READING OF NONVOLATILE MEMORIES", by Luigi Pascucci, Silvia Padoan, Carla Maria Golla, Marco Maccarrone and Marco Olivo, and filed on Feb. 21, 1995, which claims priority from European Patent Application No. 94830074.4, filed on Feb. 18, 1994, all of which are incorporated herein by reference.

1. Field of the Invention

The present invention relates to a programmable logic array structure for semiconductor nonvolatile memories, particularly flash-EEPROMs.

2. Background of the Invention

As is known, in present nonvolatile memories, the control of certain procedures formerly controlled externally tends to be integrated in the memory itself. For example, flash-EEPROM memories currently involve complex erase procedures wherein the entire memory is preprogrammed to "0", then erased, and the outcome of the operation checked and, if necessary, corrected. These operations, among other things, require sequential addressing of portions (sectors) of the array and hence state machines implementing at least a sequencer connected to a signal interpreter.

In known nonvolatile memories, the state machines required are formed by means of programmable logic arrays (PLA) in a so-called NOR-NOR configuration, i.e. in addition to input and output latch elements and an input buffer, the state machine also comprises a portion (AND plane) formed by OR-connected MOS transistors forming a number of minterms, followed by a portion (OR plane) formed by a further number of OR-connected MOS transistors connecting (if provided) each minterm to the PLA outputs.

The NOR-NOR configuration presents the disadvantage of high consumption, due to reading of the PLA requiring a first phase for precharging all the minterms, and a second evaluation phase. At the precharge phase, enabled by switching (e.g. the leading edge) of a clock signal, all the minterms are charged; and, at the evaluation phase, enabled by subsequent switching of the clock signal (in this case, the trailing edge), all but some of the minterms are discharged, and then recharged at the next read phase. This therefore results in high consumption, which increases in proportion to the size of the PLA.

In the case of digital signal processors, one proposal already made to solve the above problem is to employ, for the PLA, a so-called NAND-NOR configuration wherein the AND plane is implemented by a number of NAND transistors defining the various minterms and followed by an inverter.

Despite considerably reducing consumption by discharging only one minterm (or at any rate only the enabled minterms) after the precharge step, the above configuration is not readily applicable in cases (such as nonvolatile memories) involving high electric fields and voltages, which tend to discharge the charged capacitive nodes, thus impairing the reliability of the reading. This effect increases in direct proportion to an increase in the duration of the clock signal, in which case the time lapse between one precharge step and the next becomes increasingly comparable with the discharge time of the associated capacitances, and an even significant number of nodes may change state, thus resulting in serious read errors.

SUMMARY OF THE INVENTION

It is an object of the present invention to provide a programmable logic array for nonvolatile memories, that reduces the read time cycle and reduces read errors.

According to the present invention, there is provided a programmable logic array structure for semiconductor nonvolatile memories, particularly flash-EEPROMs, as claimed in claim 1.

BRIEF DESCRIPTION OF THE DRAWINGS

A preferred, non-limiting embodiment of the present invention will be described by way of example with reference to the accompanying drawings, in which:

FIG. 3 shows a plot of signals at various points in the FIG. 2 diagram.

DETAILED DESCRIPTION OF THE INVENTION

For the purpose of this description, the term "programmable logic array structure" is intended to mean the whole formed by the actual PLA array and the clock generator generating the signals for operating the PLA.

Figure 1:
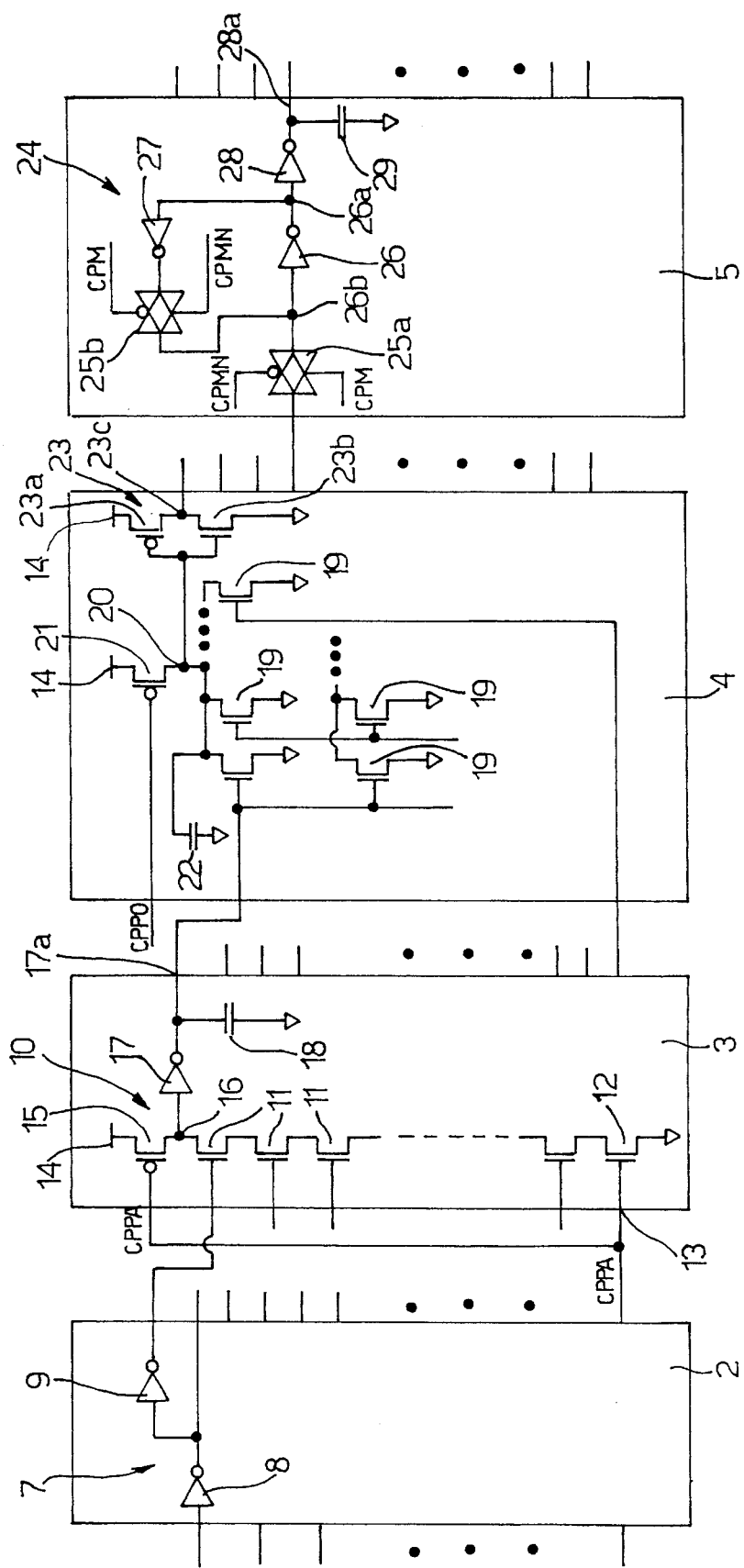
FIG. 1 shows a block diagram of the programmable logic array according to the present invention.

Number 1 in FIG. 1 indicates a programmable logic array (PLA) substantially comprising, in a known manner, the following parts: an input buffer stage 2 (possibly preceded by an input latch circuit, not shown); an AND stage or plane 3; an OR stage or plane 4; and an output latch stage 5.

More specifically, input buffer stage 2 comprises a number of buffer circuits 7 (only one shown), each formed by a pair of inverters 8 and 9 supplying at the output the inverted natural value of the respective input.

AND plane 3 comprises a number of MOS transistors forming a number of minterms 10 of which only one is shown, partially. Each minterm 10 comprises a given number of (in this case, eighteen) N-channel transistors 11 (some short-circuited or absent, depending on the logic function implemented by the desired program) connected in series with one another, with the gate terminals connected to the inputs of AND plane 3 (natural and/or inverted outputs of input buffer stage 2). Between the bottom transistor 11 of each minterm 10 and ground, there is provided a first N-channel precharging transistor 12 with the gate terminal connected to an input 13 of AND plane 3, supplied with an AND plane precharging signal CPPA generated by a circuit described later on with reference to FIG. 2. A second P-channel precharging transistor 15 is interposed between the top transistor 11 of each minterm 10 and supply line 14, and also presents the gate terminal connected to input 13 and supplied with precharging signal CPPA. Node 16 between top transistor 11 and second precharging transistor 15 defines the output of minterm 10, and is connected to an inverter 17 for resetting the AND logic from the dynamic NAND configuration implemented by minterms 10. The outputs 17a of inverters 17 (only one shown) represent the output nodes of the AND plane. Between output 17a and ground, there exits a capacitance associated with the output node shown as capacitor 18.

OR plane 4 comprises a number of N-channel MOS transistors 19 OR-connected in groups, i.e. with the gate terminals connected in known manner to the inputs of OR plane 4, the source terminals grounded, and the drain terminals connected in groups to nodes 20. In known manner, some of transistors 19 may be absent, in which case, there is no connection between a predetermined output of the AND plane and a predetermined output of the OR plane. Between each node 20 and supply line 14, there is provided a P-channel precharging transistor 21, the gate terminal of which is supplied with an OR plane precharging signal CPPO. A capacitance 22 is interposed between node 20 and ground, represented by capacitor 22 being the equivalent capacitance of node 20. Node 20 is connected to an inverter 23 formed by two opposite transistors 23a and 23b. More specifically, transistor 23a is a P-channel type with the source terminal connected to supply line 14; the gate terminal connected to node 20 (together with the gate terminal of transistor 23b); and the drain terminal connected to the drain terminal of transistor 23b, which is an N-channel type with a grounded source terminal. The common node 23c between transistors 23a and 23b defines an output of OR plane 4, and is connected to an input of output latch stage 5.

Output latch stage 5 comprises a number of latch circuits 24, each comprising a first switch 25a supplied with two opposite storage enabling signals CPM and CPMN for closing switch 25a when CPM is high, and opening it when CPMN is high. A first inverter 26 is provided downstream from switch 25a, with its output 26a connected to a feedback inverter 27, the output of which is connected via a second switch 25b to the input 26b of first inverter 26. Second switch 25b is controlled in an opposite way with respect to first switch 25a by signals CPM and CPMN, so that it is open when signal CPM is high, and closed when CPMN is high. A third inverter 28 is input-connected to node 26a of first inverter 26, and defines, with its output 28a, one of the outputs of latch stage 5. A capacitance is interposed between output node 28a and ground, represented as the capacitor 29 being the equivalent capacitance of node 28a.

Figure 2:
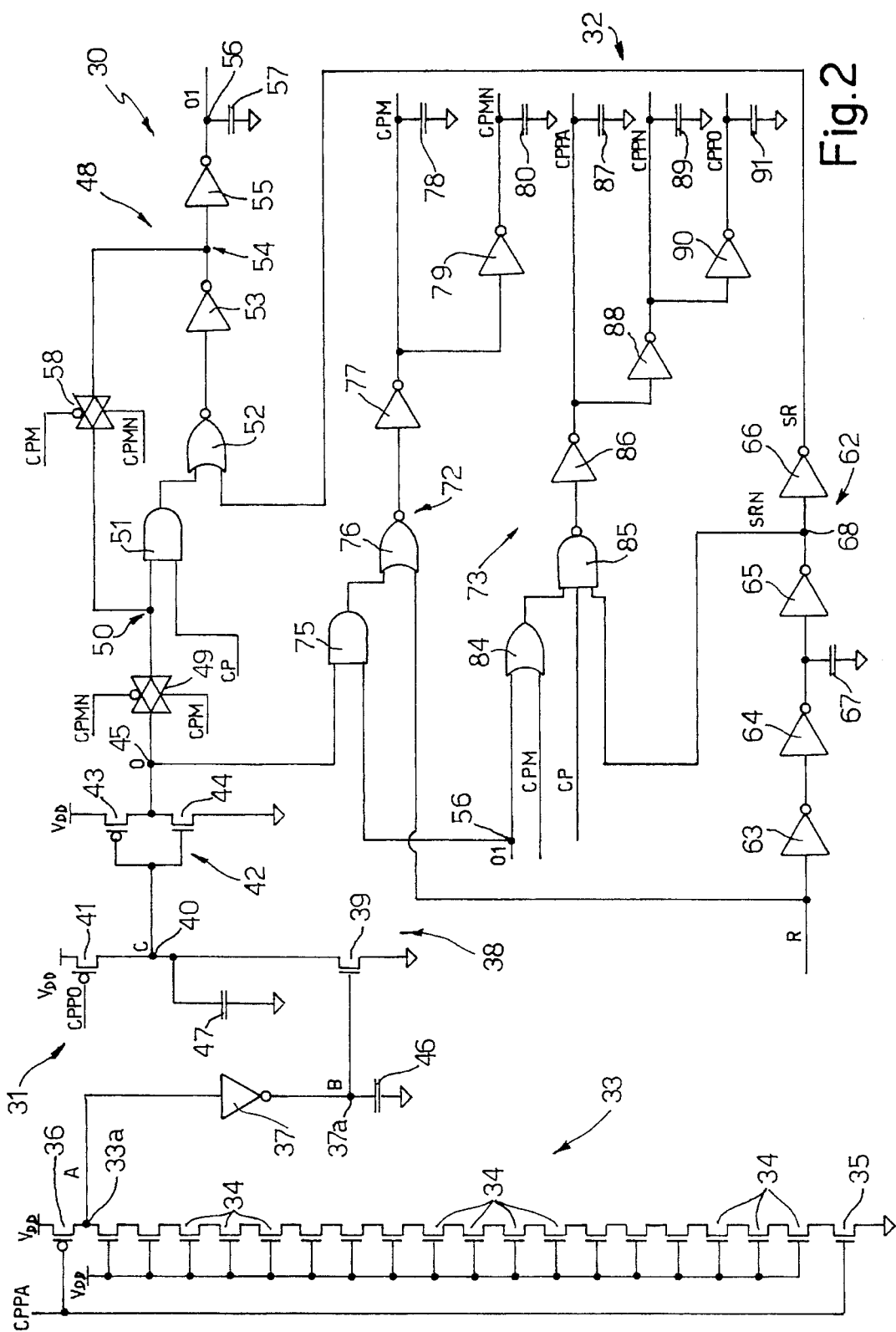
FIG. 2 shows a circuit diagram of the clock source of the FIG. 1 array.

FIG. 2 shows the generator 30 for generating the timing signals for operating the programmable logic array in FIG. 1. As shown, generator 30 is composed of an array duplicating section 31 reproducing logic array structure 1 and including stages 3–5; and a monostable section 32 in which the PLA 1 evaluating and memorizing signals are generated.

As shown in FIG. 2, array duplicating section 31 comprises elements exactly duplicating the dimensions of corresponding elements in array 1, so that the propagation delays of generator 30 are identical to those governing precharging, evaluating and latching of array 1. Monostable section 32, on the other hand, generates the timing signals as of low-to-high switching of an external clock signal CP, taking into account the delays in the array duplicating section, and in such a manner that reading of the array lasts only as long as necessary, regardless of the period of clock signal CP. In this way, the PLA 1 signal sequence depends on a single switching edge of the clock signal.

More specifically, array duplicating section 31 comprises an AND plane duplicating portion 33 including a number of transistors 34 connected in series, with the gate terminals connected to one another and to supply line $V_{DD}$ corresponding to line 14 in FIG. 1. Transistors 34 correspond to transistors 11 of each minterm 10 of AND plane 3 of array 1. The source terminal of the bottom transistor 34 is grounded via an N-channel precharging transistor 35 supplied at the gate terminal with signal CPPA enabling precharging of the AND plane. The drain terminal of top transistor 34 (node 33a), which supplies signal A, is connected to supply line $V_{DD}$ via a P-channel precharging transistor 36 supplied at the gate terminal with signal CPPA. Node 33a is connected to an inverter 37, the output of which defines an output node 37a of AND plane duplicating portion 33 (supplying signal B) and is connected to the input of an OR plane duplicating portion 38. Portion 38 comprises a transistor 39 with the gate terminal connected to node 37a, the source terminal grounded, and the drain terminal defining a node 40 (supplying signal C). Node 40 is connected to supply line $V_{DD}$ via a P-channel precharging transistor 41 supplied at the gate terminal with signal CPPO enabling precharging of the OR plane. Node 40 is connected to an inverter 42 formed by a pair of complementary transistors 43 and 44 connected in series, with the gate terminals connected to node 40. More specifically, transistor 43 is a P-channel type, with the source terminal connected to supply line $V_{DD}$ and the drain terminal connected to the drain terminal of transistor 44 (N-channel type) and defining the output node 45 of OR plane duplicating portion 38 (at which signal O is supplied). The source terminal of transistor 44 is grounded.

In FIG. 2, capacitor 46, connected between node 37a and ground, simulates the parasitic capacitance associated with all the transistors 19 of OR plane 4 of PLA 1 to be driven by minterm 10; and capacitor 47 shown connected between node 40 and ground simulates the parasitic capacitance seen by nodes 20 of OR plane 4 (capacitance 22).

Node 45 is connected to an output latch duplicating circuit 48 having the same structure as latches 24 of PLA 1, for simulating the signal propagation delay through stage 5 of array 1, and ensuring the outputs of OR plane 4 of array 1 are memorized correctly in latches 24 before array 1 returns to the precharge state.

More specifically, circuit 48 comprises a switch 49 controlled by a storage enabling signal CPM so as to close when signal CPM is high, and open when inverted signal CPMN is high. Switch 49 is interposed between output 45 and a node 50 connected to one input of an AND gate 51, the second input of which is supplied with external clock signal CP. The output of AND gate 51 is connected to one input of a NOR gate 52, the other input of which is supplied with a signal SR generated by monostable section 32. The output of NOR gate 52 is connected to the input of an inverter 53, the output of which defines a node 54 and is connected to an inverter 55, the output of which defines a node 56 supplying a signal 01. A capacitor 57 is provided between node 56 and ground. Node 54 is also connected to node 50 via a switch 58 supplied with signals CPM and CPMN and operating in opposition to switch 49, i.e. is closed when signal CPM is low, and open when signal CPMN is high, so that node 50 is supplied alternatively with signal O at output 45 of OR plane duplicating portion 38, or the signal at node 54.

Monostable section 32 comprises a branch 62 for generating a delayed reset signal, and including four cascade connected inverters 63–66, the most upstream one of which 63 is supplied with a reset signal R which is doubly inverted by inverters 63 and 64. A capacitor 67 is provided between the output of inverter 64 and ground, for delaying the switching edge of the reset signal. The output of inverter 64 is also connected to inverter 65, the output node 68 of which thus presents a delayed inverted reset signal SRN which, inverted by inverter 66, produces a delayed reset signal SR which is supplied to NOR circuit 52.

Monostable section 32 also comprises a branch 72 for generating storage enabling signal CPM; and a branch 73 for generating precharging signals CPPA and CPPO of the AND and OR planes.

More specifically, branch 72 comprises an AND circuit 75 having two inputs connected respectively to nodes 45 and 56, and the output of which is connected to one input of a NOR circuit 76 supplied at a second input with reset signal R. The output of NOR circuit 76 is connected to an inverter 77, the output of which presents storage enabling signal CPM as well as a parasitic capacitance shown schematically by capacitor 78. The output of inverter 77 is connected to a further inverter 79, the output of which thus presents an inverted enabling signal CPMN as well as a further parasitic capacitance (shown schematically by capacitor 80).

Branch 73 comprises an OR gate 84 with two inputs supplied respectively with signal O1 and signal CPM. The output of OR gate 84 is connected to one input of a NAND gate 85 having a further two inputs supplied respectively with external clock signal CP and delayed inverted reset signal SRN. The output of NAND gate 85 is connected to an inverter 86 generating AND plane precharge enabling signal CPPA, and the output of which presents a capacitor 87 representing a parasitic capacitance. The output of inverter 86 is connected to a further inverter 88, the output of which presents inverted enabling signal CPPN and a parasitic capacitance shown schematically as capacitor 89. The output of inverter 88 is also connected to an inverter 90, the output of which presents OR plane precharge enabling signal CPPO as well as a parasitic capacitance (shown schematically as capacitor 91).

Operation of generator 30 generating the timing signals of array 1 will now be described with reference also to FIG. 3 which shows a plot of some of the main signals of generator 30.

The signal sequence commences upon high-to-low switching of reset signal R, after which it is governed by periodic low-to-high switching of clock signal CP.

Initially, between $t_0$ and $t_1$, reset signal R is high, so that SRN is low, SR is high, the output of NOR circuit 76 is low, signal CPM is high, and signal CPMN low. This condition is desired so that outputs 28a of output latch stage 5 of array 1 are all charged to "0" as explained below. Since SRN is low, the output of NAND circuit 85 is high, and the output of inverter 86 and signals CPPA and CPPO are low. Consequently, array 1 is in precharge mode (transistors 15, 21 on, transistor 12 off); transistor 36 is on; signal A at node 33a is high; signal B is low; transistors 39 and 41 are respectively off and on; signal C is high; signal O is low; switch 49 is closed; switch 58 is open; the output of gate 51 is low; but the output of NOR gate 52 is low due to signal SR being high, so that signal O1 is low. Moreover, in PLA 1, precharging transistors 21 are on, so that nodes 20 are high, nodes 23c are low, switches 25a are closed, and switches 25b open, so that outputs 28a are charged to "0".

At instant $t_1$, reset signal R switches to low, at which point clock signal CP may be low or high. A low clock signal poses no problem; whereas, in the event of a high clock signal (as shown in FIG. 3 to indicate the characteristics of the generator) switching of the reset signal must be prevented from being interpreted as the leading edge of signal CP. For this purpose, generator 30 in FIG. 2 presents a delayed reset signal SR which switches with a delay with respect to reset signal R for preventing circuit error as explained below.

More specifically, between $t_1$ and $t_2$ (instant at which delayed signal SR switches), switching of R causes NOR gate 76 (which sees two "0" at the input) to switch to high and inverter 77 to low, so that signal CPM switches to low and signal CPMN to high. Switching of R, however, has no effect on branch 73, due to signal SRN, in the above time interval, remaining low and so preventing erroneous switching of NAND gate 85. Similarly, no change occurs in the state of circuit 48, due to signal SR maintaining a low output of NOR gate 52 and hence a high output 54. Switching of CPM, however, opens switch 49, and closes switch 58 to feed back its output (node 54) and isolate it from node 45, so that the inputs of AND gate 51 present two high signals (CP and the output of inverter 53).

At instant $t_2$, SR also switches to low, but with no change in the state of circuit 30, due to no change occurring in the state of NAND gate 85 (low output of OR gate 84, due to O1 and, by now, also CPM being low) or in the state of NOR gate 52 (SR has switched to low, but the output of gate 51 is high). Conversely, if CP is already low when SR switches, resetting of output latch duplicating circuit 48 is commenced immediately, as described below with reference to interval $t_3$–$t_4$.

Upon clock signal CP switching to low (instant $t_3$), AND gate 51 switches to low and, after a delay depending on the capacitance of capacitor 57, signal O1 switches to high (resetting latch duplicating circuit 48). The rest of generator 30, however, remains in the same state as previously. More specifically, no switching occurs of gate 85, due to CP first switching to zero and O1 then switching to "1".

Upon CP switching back to high (instant $t_4$), a sequence is enabled for evaluating the AND and OR planes of array 1 and memorizing the results (array reading).

More specifically, upon CP switching to "1", CPPA immediately switches to high (O1 and SRN high) thus terminating the precharge signal, so that, in array 1 in FIG. 1, second precharging transistor 15 is turned off (as is transistor 36 in portion 33 in FIG. 2), first precharging transistor 12 is turned on (as is transistor 35 in portion 33), and the PLA 1 input configuration at each minterm is evaluated in AND plane 3. Shortly after CPPA switches, CPPO also switches (instant $t_5$), with a delay with respect to CPPA due to the double inversion by inverters 88, 90 and the presence of capacitor 89, so as to commence evaluation of OR plane 4. In practice, switching of signal CP results in the switching of predetermined outputs of the AND and OR planes and respective duplicating sections according to the sequence described below. More specifically, in PLA 1, the output nodes 16 of minterms 10 whose transistors 11 are all turned on (high gate terminal) switch to low (like node 33a in FIG. 2—see signal A in FIG. 3), so that respective nodes 17a switch to high (like node 37a in FIG. 2—see signal B in FIG. 3) thus permitting evaluation of OR plane 4 as soon as signal CPPO also switches. Subsequently, precharging transistors 21 (FIG. 1) and 41 (FIG. 2) are turned off, and OR plane transistors 19 connected to the enabled nodes 17a are turned on, thus switching the respective node 20 to low (just as transistor 39 is turned on to switch signal C to low in FIG. 3); and the enabled output nodes 23c of OR plane 4 and node 45 (supplying signal O) switch to high (see also FIG. 3).

Low-to-high switching of signal O enables the storage signal. More specifically, in FIG. 2, the output of AND gate 75 switches to high (switch 49 is still open, and O1 still high) followed by switching of NOR gate 76, the output of which switches to low, and of signals CPM and CPMN (instant $t_6$, FIG. 3) which close switches 25a of latches 24 and switch 49 of circuit 48, and open switches 25b of latches 24 and switch 58 of circuit 48, so that the output signals of the OR plane and signal O may be sampled and loaded into the respective latches. In particular, propagation of signal O in circuit 48 (which reproduces the propagation delay of the OR plane outputs of PLA 1) switches AND gate 51 to high, NOR gate 52 to low, node 54 to high, and output 56 (signal O1) to low (FIG. 3).

With a delay depending on the capacitance of capacitor 57, high-to-low switching of O1 switches the output of AND gate 75 to low, gate 76 to high, and CPM to low (instant $t_7$) thus terminating the latching signal, so that switches 25a of latches 24 in FIG. 1 open (as does switch 49 in circuit 48), and switches 25b of latches 24 close (as does switch 58) to freeze the respective output at nodes 28a and 56.

Switching of CPM restores the circuit to its initial state by switching OR gate 84 to low, NAND gate 85 to high, and signals CPPA and CPPO successively to low; and PLA 1 (and duplicating section 31) is restored to precharge mode by switching the formerly enabled outputs 16, 17a, 20, 23c (and 33a, 37a, 40, 45). As such, reading (including evaluation and latching) lasts only as long as strictly necessary, thus minimizing discharging of the non-enabled minterm outputs. Moreover, in the present precharge phase, only the minterms 10 discharged in the newly terminated read phase are charged from zero, while the charge of any nodes not involved in the reading but which may have been discharged capacitively to a small extent is completed, also taking into account the high fields and voltages present in the chip integrating the memory.

Subsequently (instant $t_8$), high-to-low switching of signal CP again resets latch duplicating circuit 48 (O1 switches to high) as already described for interval $t_3$–$t_4$.

As will be clear from the foregoing description, generator 30 generates the various signals required for reading PLA 1 by so separating them as to permit safe evaluation of both AND plane 3 and OR plane 4 of PLA 1. The output of AND plane duplicating portion 33 (signal A) in fact switches to zero at the speed permitted by discharging of the parasitic capacitance due to series transistors 34 and corresponding to the parasitic capacitance due to series transistors 11 of AND plane 3; node 37a supplying signal B is charged capacitively like the corresponding node 17a of AND plane 3; and node 40 supplying signal C is also charged like output nodes 20 of OR plane 4. All the circuit component elements of array duplicating section 31 may advantageously form part (in the device layout) of PLA 1 itself, in which case, reproduction of the evaluation delays is guaranteed.

As already stated, signal CPPO is generated as of signal CPPA to ensure node 40 supplying signal C remains in precharge mode throughout evaluation of AND plane 3. In any case, signal B may only switch to high if signal A switches to low, thus eliminating any possibility that signal B may damage a "1" value of signal C due solely to the stored charge of capacitance 47 connected to node 40.

Moreover, the output latch signal from PLA 1 may only commence upon signal C switching to zero as a result of signal O switching and signal O1 being reset and so switching CPM.

As already stated, at this point, circuit 48 provides for defining the "1" duration of the latch signal (CPM) by duplicating the propagation times in latches 24 and by means of capacitor 57 which takes into account the capacitance of the line connected to output 28a of each latch 24, for ensuring the output of PLA 1 is memorized correctly in latches 24 before PLA 1 returns to precharge mode.

The FIG. 2 circuit advantageously presents capacitors 57, 89 and 67, the value of which may be so determined at design level as to allow the circuit a certain margin of safety in the definition of the delays between the switching edges of the signals, to take into account the size of the specific array and the nonvolatile memory comprising the array and generator 30. More specifically, capacitor 57 at node 56 increases the "1" duration of signal CPM at the latching phase to allow for the rise time of outputs 28a of PLA 1 (depending on the capacitive charge seen by outputs 28a); capacitor 89 at the output of inverter 88 provides for regulating the switch delay of CPPO with respect to CPPA (interval $t_4$–$t_5$); and capacitor 67 at the output of inverter 64 provides for regulating the delay of SRN and SR with respect to reset signal R.

As already stated, the "monostable" solution described for reading dynamic PLA 1 therefore presents the advantage that reading, i.e. the evaluation of nodes whose logic value depends on the parasitic capacitance of CMOS gates (subject to unpredictable losses), lasts only as long as strictly necessary, regardless of the period of the PLA clock signal (CP), so that a dynamic AND-OR structure may safely be implemented for the PLA despite the field and voltage conditions of the nonvolatile arrays involved.

Circuit 2 also provides for simplifying the structure of stage 5, while at the same time ensuring resetting. In fact, as described above in connection with interval $t_0$–$t_1$, signal R provides for resetting the PLA and switching all the outputs 28a of output latch stage 5 to "0" with no need for special reset elements or inputs, thus simplifying the structure and enabling considerable saving in terms of layout.

Clearly, changes may be made to the array and clock generator as described and illustrated herein without, however, departing from the scope of the present invention.

We claim:

1. A programmable logic array structure for semiconductor nonvolatile memories, particularly flash-EEPROMs, comprising:

a PLA including an AND stage, an OR stage and an output latch stage cascade connected to one another, said AND stage having a NAND configuration followed by non-clocked logic inverters; and a clock generator for generating a clock signal having a switching edge, said clock generator having a monostable read enabling circuit, the clock generator controlling said AND stage and said OR stage and said output latch stage such that said AND stage and said OR stage are evaluated in a same clock period following a same switching edge of the clock signal.

2. A structure as claimed in claim 1 wherein said read enabling circuit comprises a precharge/evaluation enabling circuit and a latch enabling circuit for respectively generating precharge/evaluation signals and a latch signal; said precharge/evaluation and latch enabling circuits comprising an enabling input supplied with an external clock signal, so as to switch, in succession, to a read enabling state on receiving a predetermined switch edge of said external clock signal, and to be disabled after a time corresponding to complete reading of said array.

3. A structure as claimed in claim 2 wherein said clock generator comprises an array duplicating section generating at the output an array propagation duplicating signal, and including an AND plane duplicating portion, an OR plane duplicating portion and an output latch duplicating circuit cascade connected to one another and presenting the same structure and substantially the same propagation times as said AND stage, said OR stage and said output latch stage of said array.

4. A structure as claimed in claim 3 wherein said latch enabling circuit comprises a first logic section supplied with an OR plane propagation signal generated by said OR plane duplicating portion, and with said array propagation duplicating signal, for enabling a latching step at the end of the signal propagation time in said AND plane duplication portion and said OR plane duplicating portion of said clock generator, and for interrupting said latching step at the end of the signal propagation time in said output latch duplicating circuit.

5. A structure as claimed in claim 4 wherein said first logic section comprises a first logic circuit having a first and second input supplied respectively with said OR plane propagation signal and said array propagation duplicating signal, for generating at the output a first latch enabling signal when said signals at said first and second inputs of said first logic circuit present a state indicating end of propagation and reset of the output latch duplicating circuit.

6. A structure as claimed in claim 5 wherein said latch enabling section further comprises a second logic circuit having an input supplied with a structure reset signal, for generating at the output a second latch enabling signal when said structure reset signal presents a first logic state.

7. A structure as claimed in claim 3 wherein said precharge/evaluation enabling circuit comprises a second logic section supplied with said external clock signal and said latch signal, for generating an evaluation signal enabled by a predetermined switching edge of said external clock signal, and disabled by a predetermined switching edge of said latch signal.

8. A structure as claimed in claim 7 wherein said second logic section comprises a disabling circuit supplied with a delayed structure reset signal and which disable said evaluation signal when said delayed structure reset signal presents a predetermined logic state corresponding to a reset state of said clock generator.

9. A structure as claimed in claim 7 wherein said second logic section comprises a first output supplying an AND plane evaluation signal and connected to said AND plane of said array; and a second output connected to said first output via a delay circuit; said second output supplying an OR plane evaluation signal to said OR plane of said array.

10. A structure as claimed in claim 8 wherein said second logic section comprises a third logic circuit having an input connected to said output latch duplicating circuit and said latch enabling section, for generating at the output an intermediate enabling signal when said latch signal of said array propagation duplicating signal presents a predetermined logic level; and a fourth logic circuit supplied with said intermediate enabling signal, said external clock signal and said delayed structure reset signal, for generating at the output said evaluation signal when said intermediate enabling signal, said external clock signal and said delayed structure reset signal present a predetermined logic level.

11. A structure as claimed in claim 3 wherein said AND plane duplicating portion comprises a first number of transistors series connected between a first and second reference potential line via a respective first and second controlled switch operating in push-pull manner and having control terminals supplied with said precharge/evaluation signal; said first number of transistors having control terminals connected together to said first reference potential line.

12. A structure as claimed in claim 11 wherein said PLA comprises minterms formed by a second number of transistors and the number of transistors in said first number equals the maximum number of transistors in said second number.

13. A structure as claimed in claim 3 wherein said output latch duplicating circuit comprises a third logic section supplied with an OR plane propagation signal, generated by said OR plane duplicating portion, and with said external clock signal, for switching said array propagation duplicating signal from a first to a second logic level when said external clock signal presents said predetermined switching edge, and from said second to said first logic level with a predetermined delay following reception of a predetermined switching edge of said OR plane duplicating signal.

14. A structure as claimed in claim 13 wherein said predetermined delay is adjustable.

15. A structure as claimed in claim 13 wherein said output latch duplicating circuit comprises a fifth logic circuit having a first input connected to an output of said OR plane duplicating portion via a third controlled switch, a second input supplied with said external clock signal, and an output connected to an input of said output latch duplicating circuit; and a fourth controlled switch interposed between an output of said output latch duplicating circuit and said first input of said fifth logic circuit; said third and fourth controlled switches being controlled with opposite phase by said latch signal so that said third controlled switch is closed and said fourth controlled switch is open when said latch signal is enabled, and vice versa.

16. A structure as claimed in claim 15 wherein said output latch duplicating circuit comprises a sixth logic circuit having a first input connected to said output of said fifth logic circuit, and a second input connected to a reset delay circuit, for generating a signal disabling switching of said array propagation duplicating signal from said first to said second level for a predetermined time following switching of a structure reset signal.

17. A structure as claimed in claim 3 wherein said precharge/evaluation enabling circuit and said latch enabling circuit each comprise a reset circuit having respective inputs supplied with a reset signal, for generating a predetermined level of said precharge/evaluation signals and said latch signal for resetting said AND and OR stages and enabling latching by said output latch stage in the presence of a predetermined level of said reset signal.

18. A method of generating clock signals for a programmable logic array structure for semiconductor nonvolatile memories, particularly flash-EEPROMs, comprising the steps of:

generating an array reading signal and a precharge signal; characterized in that said step of generating a read signal includes the step of generating a monostable read signal that is enabled by a predetermined switching edge of an external clock signal, and is disabled after a selected time corresponding to complete reading of said array.

19. A method as claimed in claim 18, in a clock generator comprising an array duplicating section including an AND plane duplicating portion, an OR plane duplicating portion and an output latch duplicating circuit cascade connected to one another; and a monostable section generating timing signals for said programmable logic array; characterized in that it comprises the steps of:

generating a latch reset signal for said output latch duplicating circuit upon detection of a switching edge, opposite to said predetermined edge, of said external clock signal;

generating an AND plane evaluation signal upon detection of said predetermined switching edge of said external clock signal and said latch reset signal;

generating an OR plane evaluation signal delayed with respect to said AND plane evaluation signal;

generating a duplicate AND plane output signal upon detection of said AND plane evaluation signal;

generating a duplicate OR plane output signal upon detection of said OR plane evaluation signal and said duplicate AND plane output signal;

generating a latch signal upon detection of said duplicate OR plane output signal; storing said duplicate OR plane output signal upon detection of said latch signal;

generating a signal for confirming storage of said duplicate OR plane output signal; and disabling said latch signal on receiving said storage confirmation signal.

20. A circuit structure comprising:

a programmable logic array having an array propagation time;

an output latch to read, store, and output results of said array, said output latch being series connected to said array and having an output latch propagation time; and a clock generator that provides first and second evaluation signals to said array and a latch signal to said output latch for terminating reading of said array upon completion of a time period that equals the time required to store the output of said array.

21. A structure of claim 20 wherein said array further comprises:

an AND plane having an input connected to said clock generator to receive said first evaluation signal and having an AND plane propagation time; and an OR plane having an input connected to said clock generator to receive said second evaluation signal and having an OR plane propagation time, said AND plane, and said OR plane, and said output latch being series connected to each other.

22. A structure of claim 21 wherein said clock generator further comprises:

an array duplication circuit having a propagation time substantially the same as said array propagation time; and an output latch duplication circuit having a propagation time substantially the same as said output latch propagation time, said array duplicating circuit and said output latch duplicating circuit being series connected to each other.

23. A structure of claim 22 wherein said array duplicating circuit further comprises:

an AND plane duplicating circuit having a propagation time substantially the same as said AND plane propagation time; and an OR plane duplicating circuit having a propagation time substantially the same as said OR plane propagation time, said AND plane duplicating circuit, said OR plane duplicating circuit, and said output latch duplicating circuit being series connected to one another.

24. A structure of claim 21 wherein said clock generator further comprises a read enabling circuit to generate said first and second evaluation signals, and said latch signal in response to an external clock signal.

25. A structure of claim 24 wherein said read enabling circuit further comprises:

an evaluation circuit that generates said AND plane evaluation signals and said OR plane evaluation signals in response to said external clock signal; and a latch enabling circuit that provides said latch signals, said evaluation circuit and said latch enabling circuit switching to an enabling state on receiving a first edge of said external clock signal and being disabled after a time corresponding to complete reading of said array.

26. A structure of claim 25 wherein said latch enabling circuit further comprises:

a latch enabling logic circuit that generates said latch signal, said latch enabling logic circuit being connected to said external clock signal, said latch enabling logic circuit being supplied with an OR plane propagation duplicating circuit and with a propagation duplicating signal generated by said output latch duplicating circuit.

27. A method of reading a programmable logic array comprising the steps of:

generating an array reading signal:

reading the output of said array;

disabling said array reading signal after a selected time that corresponds to the time required to completely read the output from said array;

storing the output of said array; and terminating the reading when the storing of the output is completed.

28. A method of claim 27 wherein the step of storing the output of said array further comprises the step of latching the output of said array in an output latch.

* * * * *